United States Patent [19]
Bacchi et al.

[11] Patent Number: 5,308,222
[45] Date of Patent: May 3, 1994

[54] NONCENTERING SPECIMEN PREALIGNER

[75] Inventors: Paul E. Bacchi; Paul S. Filipski, both of Novato, Calif.

[73] Assignee: Kensington Laboratories, Inc., Richmond, Calif.

[21] Appl. No.: 701,915

[22] Filed: May 17, 1991

[51] Int. Cl.⁵ .............................................. B65G 47/24
[52] U.S. Cl. .................................... 414/783; 198/394; 414/786; 414/936
[58] Field of Search ................. 414/783, 786, 936; 198/394; 406/87

[56] References Cited

U.S. PATENT DOCUMENTS

| | | | |
|---|---|---|---|
| 4,457,664 | 7/1984 | Judell et al. | 414/779 |
| 4,887,904 | 12/1989 | Nakazato et al. | 198/394 X |
| 4,938,654 | 7/1990 | Schram | 198/394 X |
| 5,125,791 | 6/1992 | Volovich | 198/394 X |

Primary Examiner—David A. Bucci
Assistant Examiner—Janice Krizek
Attorney, Agent, or Firm—Stoel Rives Boley Jones & Grey

[57] ABSTRACT

A prealigner (10) employs an X-Y stage (20) and a rotary stage (26) to position and orient a specimen (12) without centering it on the prealigner. In a preferred embodiment, the rotary stage is mounted on the X-Y stage and receives a semiconductor (12) in a substantially arbitrary position and orientation. The prealigner employs the rotary stage and translation in only an X-axis direction to scan the peripheral edge (76) of the wafer across an optical scanning assembly (36) to form a polar coordinate map of the wafer. A microprocessor (162) determines the location and orientation of the wafer from the map and cooperates with a motor drive controller (122) to generate control signals for positioning and orienting the wafer in the preselected alignment without changing the location at which the wafer is held.

22 Claims, 6 Drawing Sheets

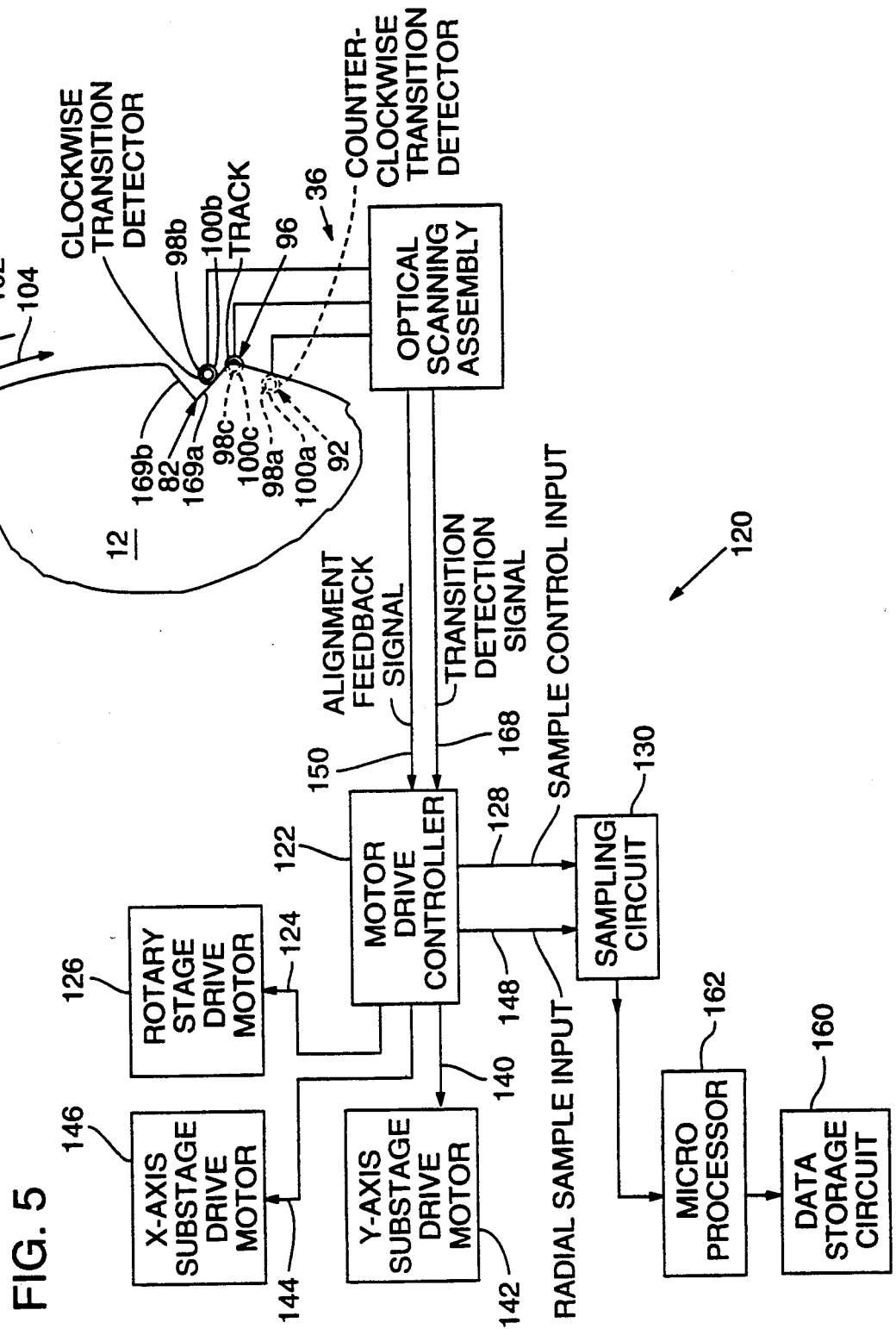

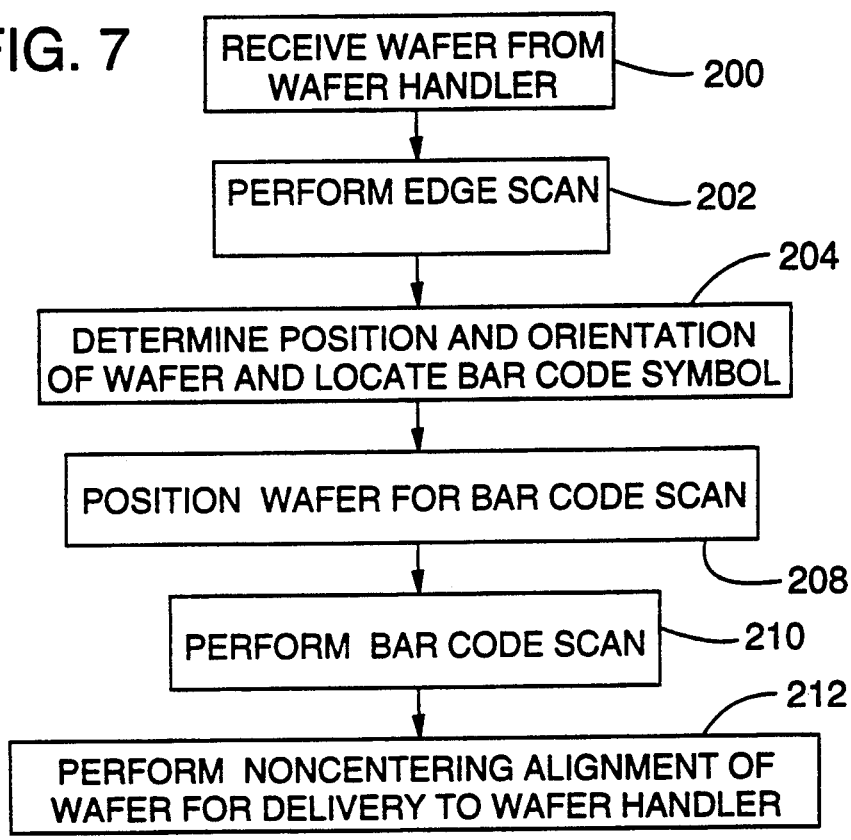

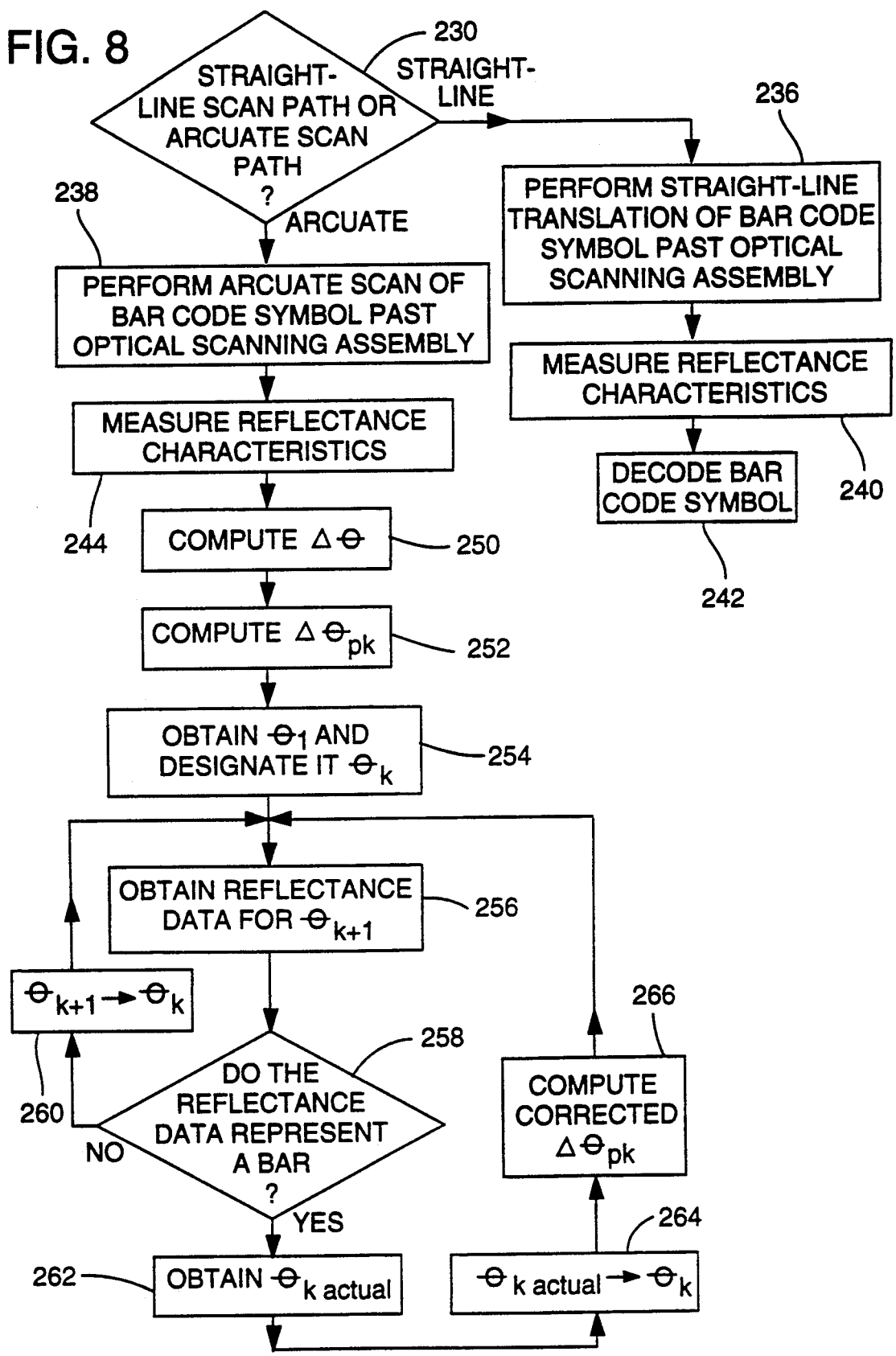

NONCENTERING SPECIMEN PREALIGNER

TECHNICAL FIELD

The present invention relates to prealigners that align specimen articles preparatory to their processing or testing and, in particular, to a prealigner that aligns an article without centering it on the prealigner.

BACKGROUND OF THE INVENTION

Specimen alignment or prealignment systems precisely position and orient articles in automated manufacturing or processing facilities. For example, an alignment system can be used to align semiconductor wafers for testing or processing during the manufacture of integrated circuits. One such wafer alignment system is described in U.S. Pat. No. 4,457,664 of Judell et al.

The Judell et al. alignment station rotates the wafer about a rotational axis that is perpendicular to the plane of the wafer to scan its generally circular perimeter with a capacitive edge sensor. The station translates the wafer along only one lateral axis to keep the perimeter aligned with the capacitive edge sensor as the wafer is rotated. Based upon information provided by a scan of the perimeter, a microprocessor computes a correction vector representing the displacement between the alignment station rotational axis and the centroid of the wafer.

The alignment station repositions the wafer in accordance with the correction vector to center the wafer centroid on the rotational axis. Specifically, the wafer is rotated about the rotational axis and moved along the one axis of lateral motion until the centroid is approximately aligned with a predetermined centered position of the rotational axis. As a consequence, the rotational axis is temporarily offset from its centered position in accordance with the correction vector.

The alignment station disengages the wafer, returns the rotational axis to its centered position, and then re-engages the wafer. Since the wafer centroid is only approximately centered on the alignment station, the wafer edge is again scanned and the wafer repositioned until its centroid is accurately centered on the rotational axis. The centered wafer is then rotated into a selected orientation and transferred to a wafer characterization station for testing.

A disadvantage of alignment stations of this type is that the wafer must be centered on the axis of rotation preparatory to positioning and orienting the wafer for testing or processing. The reason is that the alignment station uses rotation to both position the wafer centroid and to orient the wafer prior to being transferred. The wafer must be centered, therefore, so that the rotation into the selected orientation does not also change the wafer centroid position.

Another disadvantage is that centering the wafer on the alignment station is a time-consuming process that decreases wafer throughput.

A further disadvantage is that the increased handling of the wafer required to center it can increase wafer contamination, and thereby decrease the yield of integrated circuits formed therefrom.

SUMMARY OF THE INVENTION

An object of the present invention is, therefore, to provide a specimen prealigner.

Another object of this invention is to provide such a prealigner that is capable of aligning a specimen without centering it on the prealigner.

A further object of this invention is to provide such a prealigner that is capable of high-speed specimen alignment.

Still another object of this invention is to provide such a prealigner that is capable of aligning a semiconductor wafer.

Yet another object of this invention is to provide a method of operating such a prealigner.

The present invention is a noncentering specimen prealigner that positions and orients a specimen preparatory to processing by, for example, an automated test apparatus. A preferred embodiment of the noncentering specimen prealigner of the present invention includes a motor-driven rotary stage that releasibly holds a semiconductor wafer. The rotary stage rotates the wafer about a rotational axis that is perpendicular to the plane of the wafer to angularly displace its peripheral edge past an optical edge detector to perform an edge scan. The edge scan creates a polar coordinate map that includes radial distances measured from the rotational axis to the wafer peripheral edge at incremental angular intervals.

A microprocessor-based scan data processing system employs the wafer edge polar coordinate map to locate the center of the wafer and to determine its orientation. The scan data processing system then generates prealigner control signals in response to which the prealigner positions and orients the wafer in a preselected alignment for delivery to a semiconductor wafer processing station. Such processing stations include, for example, automated test or manufacturing systems.

The prealigner includes a motor-driven X-Y stage that carries and cooperates with the rotary stage to provide three degrees of motion within the plane of the wafer. The rotary stage and the X-Y stage respond to the prealigner control signals to, respectively, orient and position the wafer in the preselected alignment without disengaging or releasing the wafer. The three degrees of motion allow the prealigner to quickly align the wafer without centering it on the rotational axis. Moreover, aligning the wafer without centering it reduces the amount of contamination introduced by handling the wafer.

Additional objects and advantages of the present invention will be apparent from the following detailed description of a preferred embodiment thereof, which proceeds with reference to the accompanying drawings.

BRIEF DESCRIPTION OF THE DRAWINGS

FIG. 5 is a simplified block diagram of a scan data processing system employed in the prealigner of FIG. 1.

FIG. 7 is a flow diagram showing the overall processing of a semiconductor wafer by the prealigner of FIG. 1.

FIG. 8 is a flow diagram showing the process of performing a bar code scan.

DETAILED DESCRIPTION OF PREFERRED EMBODIMENT

Figure 1:
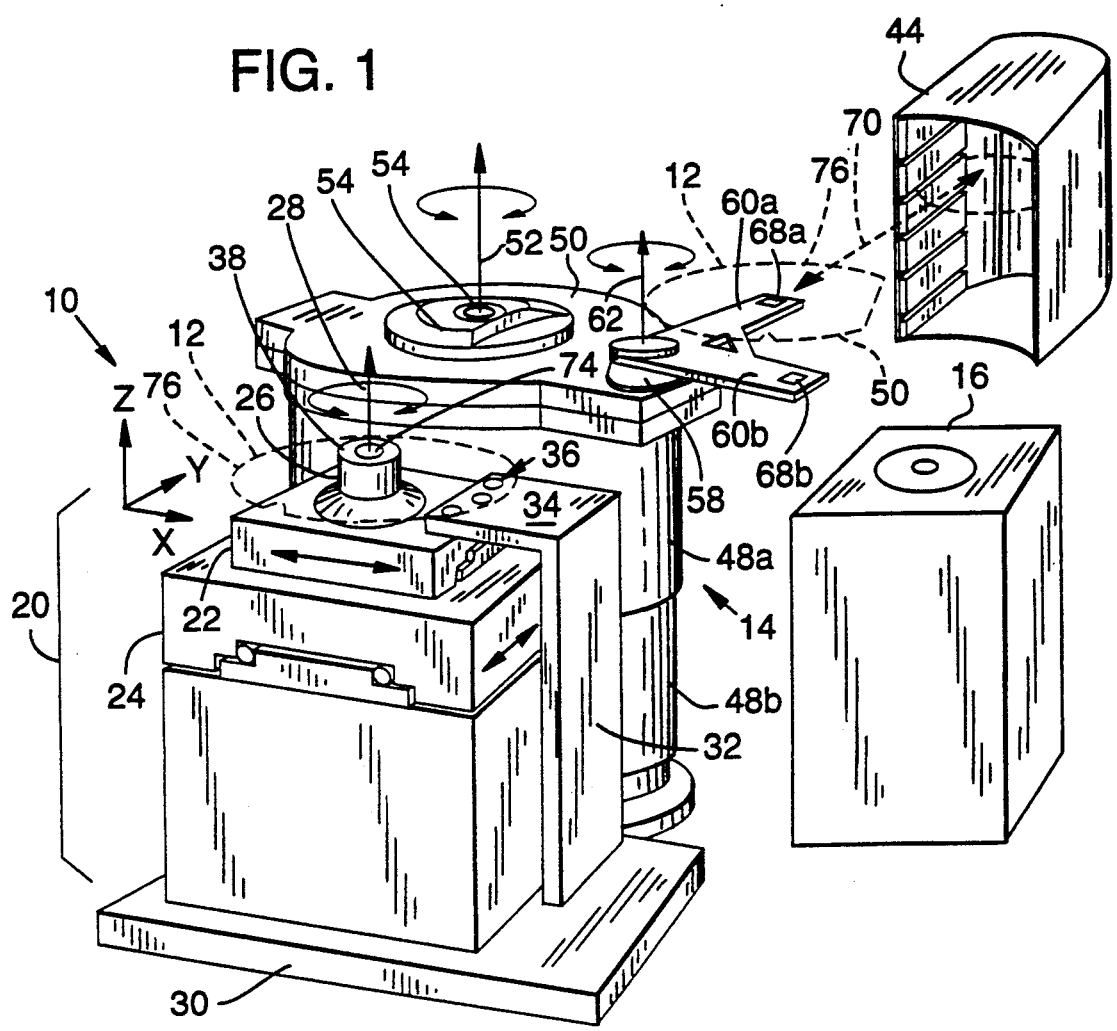
FIG. 1 is a diagrammatic isometric view of a noncentering specimen prealigner of the present invention positioned adjacent an exemplary robotic semiconductor wafer handler.
Figure 2:
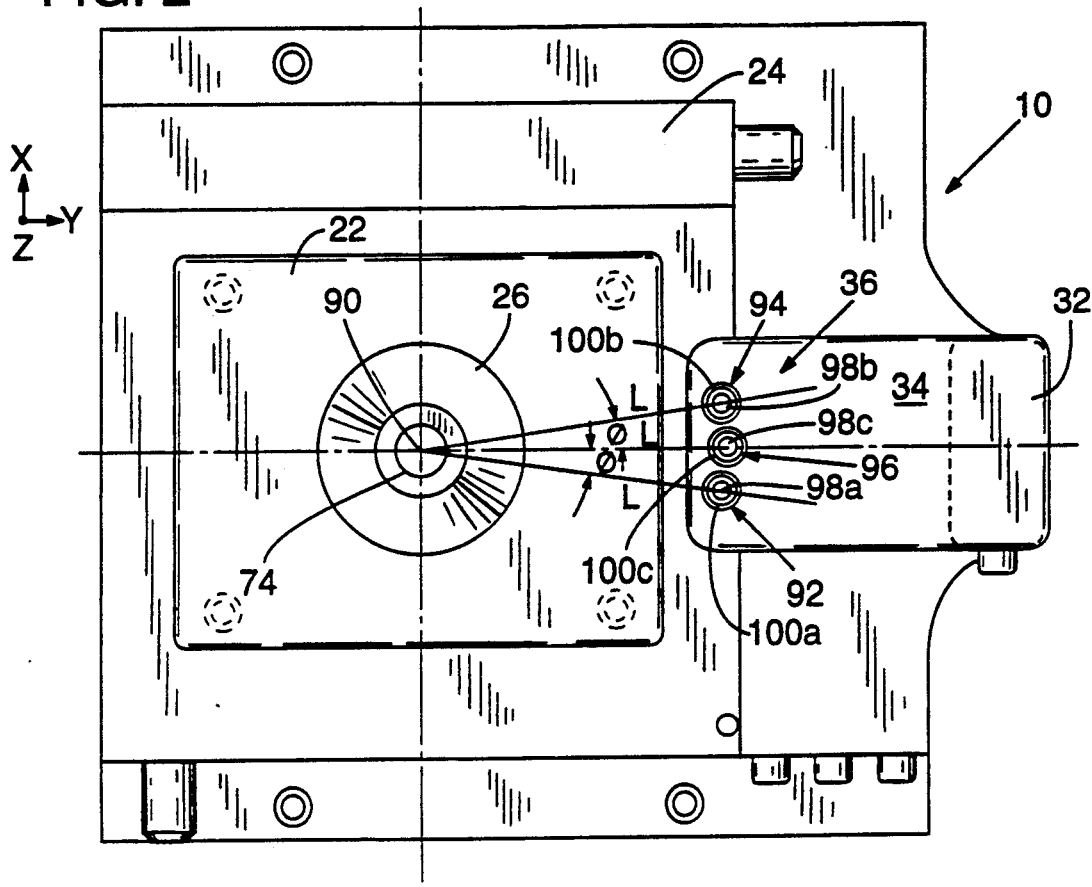
FIG. 2 is a plan view of the specimen prealigner of FIG. 1.
Figure 3:
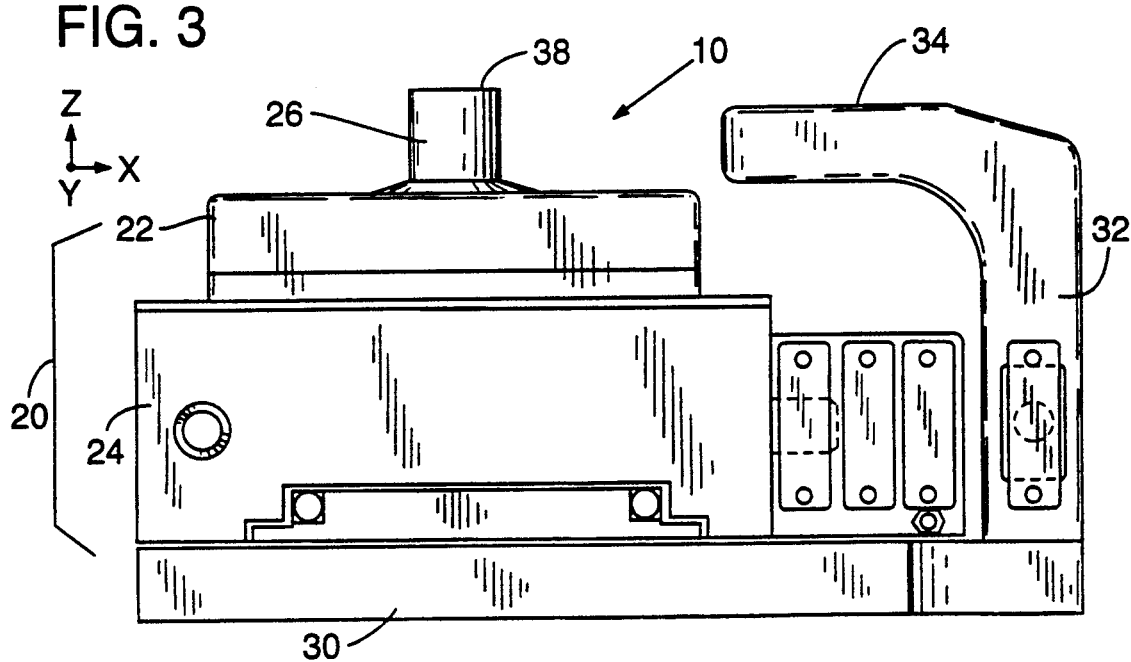
FIG. 3 is a side elevation view of the specimen prealigner of FIG. 1.

FIGS. 1, 2, and 3 are diagrams showing a noncentering specimen prealigner 10. Prealigner 10 selectively aligns a semiconductor wafer 12 with a predetermined position and orientation preparatory to transferring wafer 12 to a predetermined receiving station in an integrated circuit manufacturing facility.

In particular, prealigner 10 orients and positions wafer 12 for pickup by a robotic semiconductor wafer handler 14, which transports wafer 12 and delivers it to a semiconductor test or processing station 16. Alternatively, prealigner 10 could include processing equipment such as, for example, a laser scribing or marking apparatus for applying bar code symbols or alphanumeric characters to the wafers, or an apparatus for identifying and sorting the wafers. An advantage of such an alternative is that it reduces the handling and, therefore, the contamination of the wafer.

Prealigner 10 accurately orients and positions wafer 12 for delivery to processing station 16 in precise alignment with, for example, test probes, marking, or reading devices (not shown) employed by processing station 16. Prealigner 10 includes a motor-driven X-Y stage 20 having an X-axis substage 22 and a Y-axis substage 24 that provide translational motion in the X- and Y-axis directions, respectively. X-axis substage 22 carries a motor-driven rotary stage 26 that is adapted to releasibly hold wafer 12 and that provides rotational motion about a rotational axis 28 that is substantially parallel to a Z-axis direction. X-Y stage 20 and rotary stage 26 are capable of high resolution motion that is repeatable at increments of 0.1 micrometers and ½ arc second, respectively, and function together as a three-dimensional translational/rotational stage.

A base 30 supports X-Y stage 20 and a scan assembly support arm 32 that has a top surface 34 in which an optical scanning assembly 36 is mounted. Top surface 34 of support arm 32 is positioned below a top surface 38 of rotary stage 26 such that wafer 12 held by rotary stage 26 is positioned over scanning assembly 36.

Wafer handler 14 transports wafer 12, for example, from a wafer storage cassette 44, to prealigner 10, and then to wafer processing station 16. More specifically, wafer 12 is stored in cassette 44 at an imprecise position and with a substantially arbitrary orientation. Prealigner 10 receives wafer 12 to precisely position and orient (i.e., align) it for subsequent delivery to processing station 16.

Wafer handler 14 includes a top cylinder 48a that is concentric with and overlaps a base cylinder 48b. Top cylinder 48a carries on its top side a specimen handling platform 50. Top cylinder 48a, together with platform 50, is rotatable about and movable along a central axis 52 that is substantially parallel to the Z-axis. Wafer handler 14 is characterized, therefore, as having a "waist" between cylinders 48a and 48b.

Platform 50 includes a nonrotatable central pedestal 54 that is axially aligned with and movable along central axis 52. A wafer handler paddle pedestal 58 positioned near the periphery of platform 50 supports a pair of wafer support paddles 60a and 60b. Paddles 60a and 60b are rotatable on wafer paddle pedestal 58 about a paddle axis 62 that is substantially parallel to central axis 52.

A microprocessor-controlled drive mechanism (not shown) included within wafer handler 14 coordinates the rotation of platform 50 about central axis 52 and the rotation of paddles 60a and 60b about paddle axis 62 to achieve the desired movement for transporting wafer 12. Wafer handler 14 acquires wafer 12 from storage cassette 44 by positioning wafer paddle 60a beneath wafer 12. Platform 50 is then moved upward by raising cylinder 48a along axis 52 so that paddle 60a engages wafer 12. Vacuum pressure applied to a vacuum chuck 68a in paddle 60a secures wafer 12 to the paddle.

Wafer handle 14 moves wafer 12 along a straight-line path 70 from storage cassette 44. The microprocessor-controlled drive mechanism rotates platform 50 about central axis 52 and wafer paddle 60a about axis 62 to form the straight-line path 70. Straight-line path 70 can be achieved, for example, by rotating platform 50 in a clockwise direction while rotating paddle 60a in a counter-clockwise direction at preselected angular speeds.

After wafer 12 is removed from storage cassette 44 along straight-line path 70, platform 50 is rotated about central axis 52 to a prealigner position (not shown) from which wafer handler 14 moves wafer 12 along another straight-line path to rotary stage 26. Platform 50 is then moved downward by lowering cylinder 48a along axis 52 so that wafer 12 engages a vacuum chuck 74 located on top of turntable 26. Wafer 12 is transferred from wafer paddle 60a to vacuum chuck 74 by the coordinated release of vacuum pressure to vacuum chuck 68a and application of vacuum pressure to vacuum chuck 74.

One of the tasks prealigner 10 performs is an edge scan operation to obtain polar coordinate map data of the periphery 76 of wafer 12. The polar coordinate map data are manipulated in accordance with appropriate algorithms to compute the position and orientation of wafer 12. Periphery 76 of wafer 12 may have several edge features that may include a notch 82 (FIG. 4) and one or more flats 80 (FIG. 4, only one shown) for identifying the orientation of wafer 12. Before flat 80 and notch 82 are formed in wafer periphery 76, however, wafer 12 has a generally elliptical shape that is of slight eccentricity and is defined by intersecting major and minor axes (not shown). The position of wafer 12 is preferably determined, therefore, with respect to a wafer center 84 (FIG. 4) that is defined as the intersection of these major and minor axes.

Prealigner 10 performs the edge scan by rotating wafer 12 such that periphery 76 moves past optical scanning assembly 36 mounted on support arm 32. Upon completion of the edge scan, prealigner 10 computes the position and orientation of wafer 12 and performs a second scan to read a bar code symbol 86 (FIG. 4, outlined in phantom) positioned on the bottom major surface 88 (FIG. 6) of wafer 12, as will be described in greater detail below.

Figure 4:
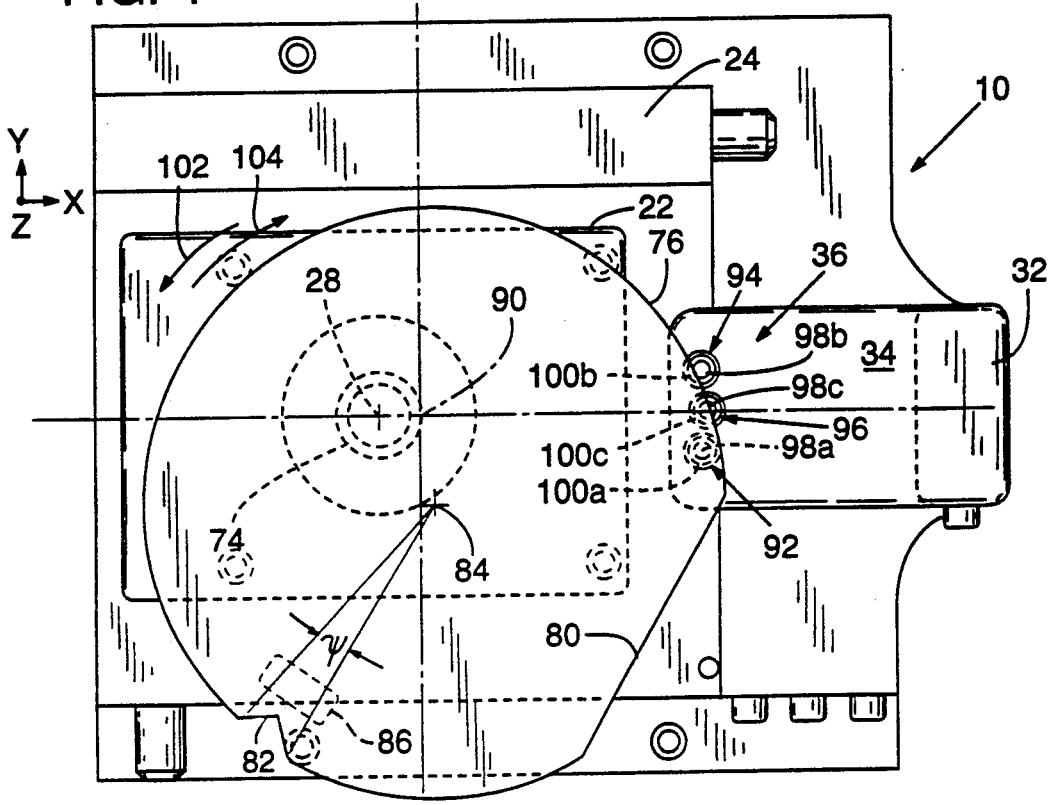
FIG. 4 is a plan view of a semiconductor wafer positioned on the specimen prealigner to undergo an edge scan.

FIG. 4 is a plan view of prealigner 10 with wafer 12 secured to vacuum chuck 74 on rotary stage 26 with wafer center 84 offset from axis 28. During the edge scan of wafer 12, rotary stage 26 rotates wafer 12 about axis 28. Y-axis substage 24 is held in alignment with a stage-centered axis 90 so that X-axis substage 22 can provide radial translation of wafer 12 to maintain periphery 76 in alignment with optical scanning assembly 36. Accordingly, X-axis substage 22 and rotary stage 26 function to determine respective r- and Θ-coordinates of the polar coordinate mapping of periphery 76.

Optical scanning assembly 36 has three optical scanning subassemblies that include two transition detector subassemblies 92 and 94 and a track subassembly 96 positioned between them. Subassemblies 92, 94, and 96 have respective light-emitting means or diodes 98a, 98b, and 98c and associated adjacent photodetectors 100a, 100b, and 100c. As shown in FIG. 2, each of the subassemblies 92, 94, and 96 is positioned a radial distance L of about 8.5 centimeters from stage-center axis 90 and is angularly offset from the others by an angle $\phi$ that is greater than or equal to about 10°. The angle $\phi$ is greater than twice the angular extent of notch 82 in periphery 76 of wafer 12.

Track subassembly 96 is positioned between transition detector subassemblies 92 and 94 so that they, respectively, lead and follow track subassembly 96 whenever wafer 12 is rotated in a counter-clockwise direction 102 during an edge scan. As a result, subassembly 92 detects (i.e., predicts) changes in selected characteristics of periphery 76 before the changes are scanned over track subassembly 96, and subassembly 94 determines when track subassembly 96 has scanned beyond the changes. It will be appreciated that the respective functions of transition detector subassemblies 92 and 94 are switched if wafer 12 is rotated in a clockwise direction 104 during an edge scan.

FIG. 5 is a simplified block diagram of a scan data processing system 120 that cooperates with optical scanning assembly 36 to compute the position and orientation of wafer 12. During an edge scan of wafer 12 in counter-clockwise direction 102, for example, light emitting diode 98c and photodetector 100c of track subassembly 96 cooperate with X-axis substage 22 and rotary stage 26 to form the polar coordinate map of periphery 76.

More specifically, a motor drive controller 122 delivers a rotation drive control signal to a control input 124 of a rotary stage drive motor 126, which responds to the control signal by rotating wafer 12 on rotary stage 26 at a preselected angular rate. Motor drive controller 122 also delivers at regular time intervals sampling control signal pulses to a sample control input 128 of a sampling circuit 130. The regular time interval between adjacent pulses corresponds to a unit incremental angular movement of rotary stage 26 (e.g., one arc second, which is approximately 0.003°). The sampling control signal pulses correspond, therefore, to the angular orientation of wafer 12 relative to optical scanning assembly 36.

Motor drive controller 122 delivers a Y-axis control signal to a control input 140 of a Y-axis substage drive motor 142 to position Y-axis substage 24 in alignment with stage-center axis 90. In addition, motor drive controller 122 delivers an X-axis control signal to a control input 144 of an X-axis substage drive motor 146 to operate as a closed loop servo-mechanism. In particular, the X-axis control signal functions to maintain periphery 76 in alignment with track subassembly 96 by ensuring that photodetector 100c continuously receives light emitted by light emitting diode 98c and reflected by wafer 12. The magnitude of the X-axis control signal corresponds to the radial position of periphery 76 relative to axis 28.

Motor drive controller 122 delivers a radial position signal to a sample input 148 of sampling circuit 130. The radial position signal corresponds to the X-axis control signal that aligns periphery 76 with subassembly 96. Sampling circuit 130 samples the radial position signal on input 148 in response to the sampling control signal received at input 128. The sampling control signal and associated radial position signal correspond, therefore, to the respective polar coordinates Θ and r of periphery 76 relative to axis 28.

During an edge scan, light-emitting diode 98c directs a light beam of a previously measured maximum intensity toward bottom surface 88 of wafer 12 to be reflected toward photodetector 100c. Photodetector 100c generates an alignment feedback signal that assumes a LIGHT, NO LIGHT, or ALIGNED state whenever, respectively, more than, less than, or a preselected amount of the light beam is reflected to photodetector 100c. The alignment feedback signal is delivered to a feedback input 150 of motor drive controller 122.

In response to the alignment feedback signal in the LIGHT and NO LIGHT states, motor drive controller 122 delivers a control signal to control input 144 of X-axis substage drive motor 146 to direct periphery 76 toward track subassembly 96. Whenever the alignment feedback signal is in the ALIGNED state, periphery 76 is aligned with track subassembly 96 by within a predefined tolerance. X-axis substage drive motor 146 maintains the radial position of axis 28 and wafer 12, and motor drive controller 122 delivers the radial position signal to sample input 148 of sampling circuit 130.

Sampling circuit 130 transfers the polar coordinate data to a data storage means or circuit 160 via a microprocessor circuit 162. After a complete edge scan about periphery 76 (i.e., a scan of 360°), data storage circuit 160 contains a complete polar coordinate map representing periphery 76 of wafer 12. Microprocessor 162 employs the polar coordinate map to determine the position of wafer center 84 relative to axis 28 and the angular locations of flat 80 and notch 82 on wafer periphery 76. Microprocessor 162 then cooperates with motor drive controller 122 to generate control signals that align wafer 12 for subsequent processing by processing station 16.

Prealigner 10 aligns wafer 12 by first rotating wafer 12 to a preselected orientation and then translating wafer 12 in the X- and Y-axis directions to a preselected position. As a result, prealigner 10 provides wafer 12 with the preselected alignment without changing the location on bottom surface 88 at which vacuum chuck 74 holds wafer 12.

In particular, microprocessor 162 determines the angular difference between the preselected orientation of flat 80 and notch 82 and their orientation immediately after the edge scan. Microprocessor 162 and motor drive controller 122 then cooperate to deliver a control signal to control input 124 of rotary stage drive motor 126 to rotate wafer 12 into the preselected orientation.

Similarly, microprocessor 162 determines the direction and distance of separation between the preselected position of center 84 and its position immediately after the edge scan. Microprocessor 162 and motor drive controller 122 then cooperate to deliver to control inputs 140 and 144 of respective drive motors 142 and 146 control signals that translate wafer center 84 in the Y- and X-axis directions to the preselected position, which is preferably stage-centered axis 90.

As a result, prealigner 10 aligns wafer 12 without centering it on rotary stage 26, thereby minimizing the handling of wafer 12. The minimized handling increases the speed at which wafer 12 can be aligned and reduces the contamination of the wafer.

Transition detector subassemblies 92 and 94 function to predict or detect contour changes in periphery 76 so that track subassembly 96 can scan periphery 76 relatively quickly and accurately. For example, flat 80, notch 82, and the generally elliptical shape of the remaining portions of periphery 76 may be considered as separate first, second, and third peripheral contours, respectively.

During the edge scan of periphery 76 in counterclockwise direction 102, relatively large contours such as flat 80 or the generally elliptical portion of periphery 76 are rotated past optical scanning assembly 36 at a relatively high angular speed between about 90° and 360° per second. Whenever it detects a transition between adjacent contours (e.g., from a generally elliptical portion of periphery 76 to flat 80), transition detector subcircuit 92 generates a transition detection signal that causes the scanning of periphery 76 to be slowed to about 40% of the high angular speed so that track subassembly 96 can accurately scan the transition.

Transition detector subcircuit 92 delivers the transition detection signal to a feedback input 168 of motor drive controller 122. In response to the transition detection signal, motor drive controller 122 delivers a control signal to control input 124 of rotary stage drive motor 126 to reduce the angular speed of rotation.

In operation, light-emitting diode 98a of transition detector subassembly 92 directs a light beam of a previously measured maximum intensity toward bottom surface 88 of wafer 12 to be reflected toward photodetector 100a. Photodetector 100a generates the transition detection signal whenever the amount of the light beam reflected to photodetector 100a changes at more than a preselected rate. A relatively high rate of change in the amount of light received by photodetector 100a indicates that transition detector subassembly 92 is crossing from one contour to another (e.g. from the generally elliptical portion to notch 82). No change or a relatively low rate of change in the amount of light received by photodetector 100a indicates that transition detector subassembly 92 is not crossing from one contour to another.

Transition detector subassembly 94 establishes the duration of the reduced rate of rotation. During an edge scan of notch 82 (FIG. 6), for example, detector subassembly 94 delivers a transition completion signal to feedback input 168 of motor drive controller 122 whenever subassembly 94 is scanned past the trailing edge 169b of notch 82. The transition completion signal is generated by photodetector 100b in response to changes in the amount of light received from light emitting diode 98b, in a manner similar to that described above with reference to transition detector subassembly 92.

In response to the transition completion signal, motor drive controller 122 delivers a control signal to control input 124 of rotary stage drive motor 126 to increase the speed of rotation to the high angular speed. As a result, notch 82 of wafer 12 is scanned at the low rate of rotation between the times that subassembly 92 detects leading edge 169a and subassembly 94 detects trailing edge 169b.

It will be appreciated that subassemblies 92 and 94 will each detect two contour transitions during the scan of the single contour transition representing notch 82; leading edge 169a and trailing edge 169b. To assure that periphery 76 is scanned at the low scan rate throughout notch 82, motor drive controller 122 includes logic circuitry (not shown) that identifies the first transition detection signal generated by subassembly 92 as the start of the contour transition, and the second transition completion signal generated by subassembly 94 as the end of the contour transition. This logic circuitry functions similarly at each contour transition.

Figure 6:
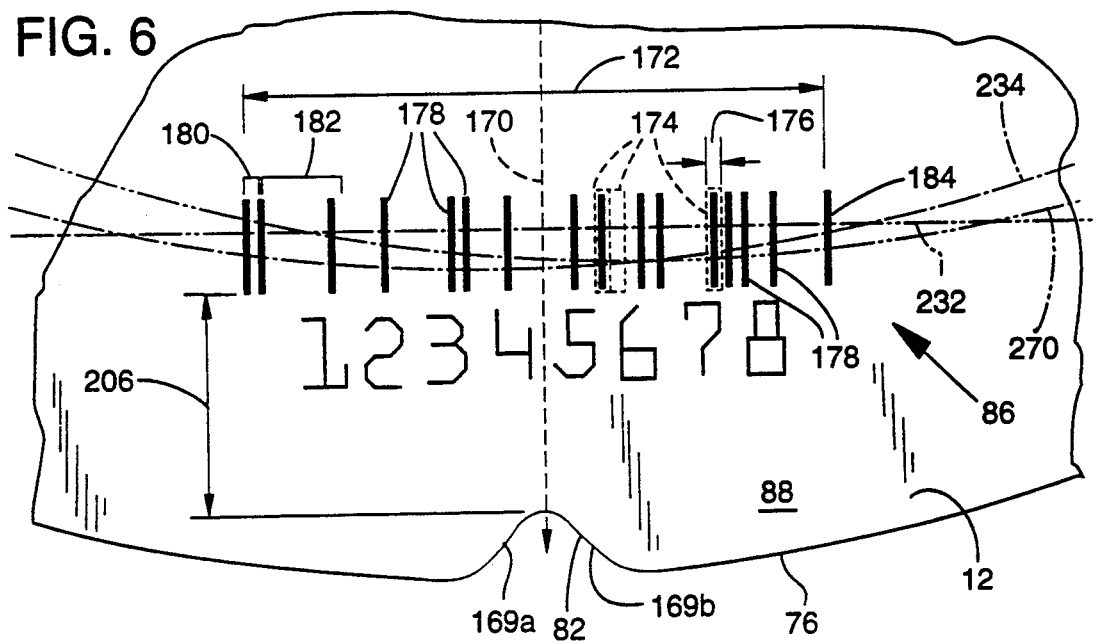
FIG. 6 is an enlarged diagram of a bar code symbol positioned on the bottom side of a semiconductor wafer processed by the prealigner of FIG. 1.

FIG. 6 is an enlarged diagram of bar code symbol 86 positioned on bottom side 88 of wafer 12. Bar code symbol 86 is bisected by a radial projection 170 that extends from center 84 of wafer 12 and bisects notch 82. In a preferred embodiment, bar code symbol 86 has a fixed bar code region of length 172 and a predetermined number of bar positions 174 of which each has a fixed width 176. As a result, bar code symbol 86 is of the "fixed width" type.

Each bar 178 is a laser scribe mark in bottom side 88 of wafer 12. Such scribe marks decrease the reflectivity of wafer 12 and function, therefore, as lower reflectance stripes that contrast with the higher reflectance spaces between them. As a result, bars 178 and the spaces between them represent binary information in a manner similar to that contained in a conventional bar code symbol.

A sequence of five adjacent bar positions 174 constitutes a binary representation of an alphanumeric message character. Since each bar position 174 may assume one of two states, each message character may represent one of thirty-two possible alphanumeric characters.

Table 1 shows the alphanumeric characters that can be rendered in the exemplary bar code symbol 86. Each message character in Table 1 is represented by a sequence of five digits in which the numerals 1 and 0 represent, respectively, the presence and absence of a bar 178 in a bar position 174. A message character is assigned to each numeric character (i.e., the numerals 0–9) and to each alphabet character except the letters B, I, N, and O. A bar code format of this type is called "binary code 32" and is comparatively space efficient because it employs only five bits for each message character.

TABLE 1

| MESSAGE CHARACTER | NUMERICAL VALUE | BINARY BAR CODE |
| --- | --- | --- |
| 0 | 00 | 00000 |
| 1 | 01 | 00001 |
| 2 | 02 | 00010 |
| 3 | 03 | 00011 |
| 4 | 04 | 00100 |
| 5 | 05 | 00101 |
| 6 | 06 | 00110 |
| 7 | 07 | 00111 |
| 8 | 08 | 01000 |
| 9 | 09 | 01001 |
| A | 10 | 01010 |
| C | 11 | 01011 |
| D | 12 | 01100 |
| E | 13 | 01101 |
| F | 14 | 01110 |
| G | 15 | 01111 |
| H | 16 | 10000 |
| J | 17 | 10001 |
| K | 18 | 10010 |
| L | 19 | 10011 |
| M | 20 | 10100 |
| P | 21 | 10100 |
| Q | 22 | 10110 |
| R | 23 | 10111 |
| S | 24 | 11000 |
| T | 25 | 11001 |
| U | 26 | 11010 |
| V | 27 | 11011 |

TABLE 1-continued

| MESSAGE CHARACTER | NUMERICAL VALUE | BINARY BAR CODE |
|---|---|---|
| W | 28 | 11100 |
| X | 29 | 11101 |
| Y | 30 | 11110 |
| Z | 31 | 11111 |

Bar code symbol 86 includes eight message characters, a first pair of bars representing a START character 180, a check or parity character 182 that includes five bar positions 174, and a single bar 184 representing a STOP character. As a result, bar code symbol 86 includes a total of 43 bar positions 174 and begins with at least two bars and ends with at least one bar.

FIG. 7 is a flow diagram showing the overall processing of wafer 12 by prealigner 10. The flow diagram is described with reference to FIGS. 1, 5, and 6.

Process block 200 indicates that prealigner 10 receives wafer 12 from wafer handler 14 in a substantially arbitrary alignment.

Process block 202 indicates that prealigner 10 performs an edge scan of wafer 12 to form a polar coordinate map of periphery 76 of wafer 12. Preferably, the edge scan is performed by a single 360° rotation of wafer periphery 76 past optical scanning assembly 36.

Process block 204 indicates that microprocessor 162 determines from the polar coordinate map the location of flat 80, notch 82, wafer center 84, and bar code symbol 86. Bar code symbol 86 is separated from notch 82 along radial projection 170 by a predetermined distance 206. Microprocessor 162 calculates the location of bar code symbol 86 by obtaining from data storage circuit 160 the radius representing the apex of notch 82 and decreasing the radius by an amount equal to predetermined distance 206, thereby to determine the radial position of bar code symbol 86.

Process block 208 indicates that prealigner 10 positions wafer 12 so that the rotationally closer one of transition detector subassemblies 92 and 94 is aligned with the computed radial position of START character 180 of bar code symbol 86. Since wafer 12 may be rotated in either counter-clockwise direction 102 or clockwise direction 104, the closer one of subassemblies 92 and 94 is separated from bar code symbol 86 by an angle of less than 180°.

Process block 210 indicates that optical scanning assembly 36 cooperates with either X-Y stage 20 or rotary stage 26 to perform a bar code scan of bar code symbol 86 to obtain a mapping of its reflectance characteristics. Edge scan 202 and bar code scan 210 can both be performed by rotating wafer 12 by less than about 1.5 revolutions.

Process block 212 indicates that prealigner 10 performs non-centering alignment of wafer 12 for delivery to wafer handler 14. The alignment of wafer 12 is adapted, for example, to be compatible with the requirements of processing station 16 to which wafer handler 14 transfers wafer 12.

FIG. 8 is a flow diagram showing the process of performing a bar code scan, which is described with reference to FIG. 6. Decision block 230 is an inquiry as to whether bar code symbol 86 will be scanned along a straight-line scan path 232 or an arcuate scan path 234. Whenever bar code symbol 86 is scanned along straight-line scan path 232, decision block 230 proceeds to process block 236. Whenever bar code symbol 86 is scanned along arcuate path 234, decision block 230 proceeds to process block 238.

Process block 236 indicates that X-axis substage 22 and Y-axis substage 24 cooperate to move bar code symbol 86 past optical scanning assembly 36 along straight-line path 232.

Process block 240 indicates that one of the transition detector subassemblies (e.g., transition detector subassembly 92) measures the reflectance characteristics of bar code symbol 86. In particular, photodetector 100a of transition detector subassembly 92 detects the reflectance change between bars 178 and bottom surface 88 of bar code symbol 86. Whenever the reflectance change is greater than a threshold difference, track subassembly 94 is capable of accurately distinguishing bars 178 and the spaces between them. Whenever the reflectance change is less than the threshold difference, optical scanning assembly 36 increases the sensitivity of photodetector 100c so that the reflectance changes are greater than or equal to the threshold difference. The measurement of the reflectance characteristics allows the sensitivity of track subassembly 96 to be calibrated accordingly to more accurately read bar code symbol 86.

Process block 242 indicates that microprocessor 162 employs the reflectance changes detected by track subassembly 96 to determine the distances between bars 178 of bar code symbol 86 along straight-line scan path 232, thereby to decode the information represented by bar code symbol 86. Microprocessor 160 employs the reflectance information delivered by track subassembly 96 to input 150 of motor drive controller 122, together with the control signals for providing the straight-line translation of bar code symbol 86, to determine the distances between bars 178 along scan path 232.

Process block 238 indicates that rotary stage 26 moves bar code symbol 86 past optical scanning assembly 36 along arcuate path 234.

Process block 244 indicates that transition detector subassembly 92 measures the reflectance characteristics in a manner similar to that described with reference to process block 240.

Process block 250 indicates that microprocessor 162 computes the angular displacement $\Delta\Theta$ between START character 180 and STOP character 184 of bar code symbol 86. Microprocessor 162 identifies START character 180 and STOP character 184 as the respective first and last decreases in reflectance detected during the bar code scan.

Process block 252 indicates that microprocessor 162 uses the angular displacement $\Delta\Theta$ and the total number N of bar positions 174 (e.g., forty-three) in bar code symbol 86 to compute an estimated unit angular pitch $\Theta_{pk}$ between possible next adjacent bar 178. In particular, microprocessor 162 computes the estimated unit angular pitch $\Delta\Theta_{pk}$ as:

$$\Delta\Theta_{pk} = \Delta\Theta/(N-1)$$

in which the factor (N−1) represents the number of spaces between the N possible bars 178 in bar code symbol 86.

Process block 254 indicates that microprocessor 162 obtains from data storage circuit 160 the angular position $\Theta_1$ corresponding to the first bar in START character 180 of bar code symbol 86. This angular position is designated the present angular position $\Theta_k$.

Process block 256 indicates that microprocessor 162 obtains from data storage circuit 160 reflectance data corresponding to the next angular position $\Theta_{k+1}$, which represents the next adjacent bar position. Microprocessor 162 identifies the angular position $\Theta_{k+1}$ by the equation:

$$\Theta_{k+1}=\Theta_k+\Delta\Theta_{pk}.$$

For example, whenever the present angular position $\Theta_k$ is equal to $\Theta_1$ and represents the first bar in START character 180, microprocessor 162 obtains from data storage circuit 160 the reflectance data corresponding to the next angular position $\Theta_2$. The angular position $\Theta_2$ corresponds to the second bar in START character 180.

Decision block 258 represents an inquiry as to whether the reflectance data at or in the vicinity of the next angular position $\Theta_{k+1}$ represent a bar 178. Whenever the reflectance data at or in the vicinity of the next angular position $\Theta_{k+1}$ do not represent a bar (i.e., the data represent a bar position 174 without a bar 178), decision block 258 proceeds to process block 260. Whenever the reflectance data in the vicinity of the next angular position $\Theta_{k+1}$ represent a bar 178, decision block 258 proceeds to process block 262.

Process block 260 indicates that the next angular position $\Theta_{k+1}$ is designated the present angular position $\Theta_k$. Process block 260 returns to process block 256.

Process block 262 indicates that processor 162 obtains from data storage circuit 160 the actual angular position $\Theta_{k\,actual}$ of the detected bar 178.

Process block 264 indicates that the actual angular position $\Theta_{k\,actual}$ of the detected bar is designated the present angular position $\Theta_k$, thereby to provide a present angular position. This step functions, therefore, as a correction of the present angular position $\Theta_k$.

Process block 266 indicates that microprocessor 162 computes a corrected unit angular pitch $\Delta\Theta_{pk}$ as:

$$\Delta\Theta_{pk}=(\Theta_k-\Theta_{k\,notch})/([0.5\times N]-K),$$

in which the factor $\Theta_{k\,notch}$ represents the angular position of the apex of notch 82 on perimeter 76 of wafer 12, and the factor K indicates that the detected bar 178 is located at the K-numbered bar position 174 in bar code symbol 86. The corrected unit angular pitch $\Delta\Theta_{pk}$ is calculated, therefore, as the unit angular pitch between the detected bar 178 at its actual angular position $\Theta_k$ actual (which has been designated $\Theta_k$) and a bar position 174 aligned with radial projection 170 (i.e. $\Theta_{k\,notch}$). The factor ([0.5×N]−K) represents the number of bar positions 174 between the detected bar 178 and the bar position aligned with radial projection 170. Process block 266 returns to process block 256.

Process blocks 262 and 266 represent corrections of, respectively, the present angular position $\Theta_k$ and the unit angular pitch $\Delta\Theta_{pk}$ in accordance with the actual angular position $\Theta_{k\,actual}$ of a detected bar 178. These corrections allow scan data processing system 120 to accurately decode bar code symbol 86 whenever it is scanned along a symmetrically positioned arcuate scan path 234 or a nonsymmetrically positioned arcuate scan path 270. Symmetrically positioned arcuate scan path 234 is formed whenever center 84 of wafer 12 is aligned with rotational axis 28 of prealigner 10. Nonsymmetric arcuate scan path 270 is formed whenever center 84 of wafer 12 is not aligned with rotational axis 28 of prealigner 10.

The process described above is directed primarily to a bar code format of the type shown in FIG. 6. In particular, the bar code format employs bars of a fixed width and spaces that are integer multiples of a unit distance. The method and apparatus of this invention are also compatible, however, with bar code formats employing bars and spaces of variable widths.

For example, such a bar code symbol may be decoded by computing from an arcuate scan path the widths of the bars and spaces along a straight line (i.e., the straight-line widths). In particular, the straight-line width of a bar may be represented as the chord of the arcuate scan path across the bar. The width w of such a chord may be represented as:

$$w=r\times\sin(\Delta\Theta_{pk}),$$

in which r represents the radial position of the optical scanning assembly during the bar code scan and $\ominus\Theta_k$ is the angular displacement across the bar.

It will be obvious to those having skill in the art that many changes may be made in the above-described details of the preferred embodiment of the present invention without departing from the underlying principles thereof. The scope of the present invention should, therefore, be determined only by the following claims.

We claim:

1. A specimen prealigner for positioning in a preselected alignment a specimen having a peripheral edge with plural contours having contour transitions between them, the preselected alignment including a selected position and a selected orientation, comprising:

holding means for releasibly holding the specimen at a first specimen location;

edge detecting means for detecting the peripheral edge of the specimen and forming a map of the specimen, the edge detecting means including first and second light emitters that direct light beams toward the peripheral edge of the specimen and first and second light detectors that receive the light beams after they strike the specimen, the first light emitter and first light detector cooperating to detect the peripheral edge of the specimen and the second light emitter and the second light detector cooperating to detect the contour transitions before they are scanned by the first light emitter and first light detector, thereby to allow the contours and contour transitions to be scanned at respective first and second scan rates; and positioning means coupled to the specimen holding means and responsive to the map formed by the edge detecting means for positioning the specimen in the preselected alignment without changing the first specimen location at which the holding means releasibly holds the specimen.

2. The prealigner of claim 1 in which the peripheral edge of the specimen lies substantially in a plane and in which the positioning means includes rotation means for rotating the specimen about a rotational axis that is perpendicular to the plane of the specimen and translating means for translating the specimen in first and second transverse directions that are substantially parallel to the plane.

3. The prealigner of claim 2 in which the first and second transverse directions are substantially perpendicular to each other.

4. The prealigner of claim 2 in which the translating means carries the rotation means.

5. The prealigner of claim 2 in which the positioning means cooperates with the edge detecting means to move the peripheral edge of the specimen past the edge detecting means to form the map of the specimen.

6. The prealigner of claim 5 in which the positioning means employs the rotation means and translation in only the first direction to move the peripheral edge past the edge detecting means.

7. The prealigner of claim 5 in which the edge detecting means includes an edge detecting element having a fixed position that is collinear with the rotational axis along a line that is substantially parallel to the first direction.

8. The prealigner of claim 1 in which the light beam striking the specimen is substantially reflected by it and in which the light detector is positioned adjacent the light emitter to receive the light beam after it is reflected.

9. The prealigner of claim 1 in which the peripheral edge of the specimen includes adjacent edge segments of first and second contours with a contour transition between them, the first and second contours are scanned at a first scan rate and the contour transition is scanned at a second scan rate, and the prealigner further comprises contour predicting means for predicting whether the edge detecting means will scan the contour transition and for generating a corresponding contour prediction signal, the positioning means scanning the contour transition at the second scan rate in response to the contour prediction signal.

10. The prealigner of claim 9 in which the positioning means is capable of moving the peripheral edge of the specimen past the edge detecting means selectively in first and second directions, and in which the contour predicting means is capable of predicting a contour transition whenever the peripheral edge is moved in either of the first and second directions.

11. A specimen prealigner for positioning in a preselected alignment a specimen having a peripheral edge that includes adjacent edge segments of first and second contours with a contour transition between them, comprising:
   edge detecting means for detecting the peripheral edge of the specimen, the edge detecting means including a first light emitter that directs a light beam toward the peripheral edge of the specimen and a corresponding light detector that receives the light beam after it strikes the specimen;
   scanning means for scanning the first and second contours of the peripheral edge past the edge detecting means at a first scan rate and for scanning the contour transition past the edge detecting means at a second scan rate; and
   contour predicting means for predicting whether the edge detecting means will scan the contour transition and for generating a corresponding contour prediction signal, the scanning means including a second light emitter that directs a light beam toward the peripheral edge of the specimen and a corresponding light detector that receives the light beam after it strikes the specimen, and the scanning means being responsive to the contour prediction signal to scan the peripheral edge with the edge detecting means along the contour transition at the second scan rate.

12. The prealigner of claim 11 in which the specimen includes a bar code symbol positioned at a preselected location on the specimen and in which the edge detecting means cooperates with the scanning means to form a specimen mapping that identifies the position of the bar code symbol.

13. The prealigner of claim 12 in which the specimen substantially reflects the light beam directed from the light emitter of the edge detecting means, the light detector of the edge detecting means is positioned adjacent its corresponding light emitter to receive the light beam directed therefrom and reflected by the specimen, and the scanning means scans the edge detecting means across the bar code symbol to read the bar code symbol.

14. The prealigner of claim 13 in which the specimen substantially reflects the light beam directed from the light emitter of the contour predicting means, the light detector of the contour predicting means is positioned adjacent its corresponding light emitter to receive the light beam directed therefrom and reflected by the specimen, and the contour predicting means measures the reflectance characteristics of the bar code symbol and generates a corresponding reflectance signal to which the edge detecting means is responsive for reading the bar code symbol.

15. The prealigner of claim 13 in which the scanning means scans the edge detecting means across the bar code symbol along an arcuate scan path and in which the prealigner further comprises computing means responsive to the reflectance signal for reading the bar code symbol.

16. The prealigner of claim 13 in which the scanning means scans the edge detecting means across the bar code symbol along a straight-line path.

17. The prealigner of claim 11 in which the scanning mean is capable of scanning the peripheral edge of the specimen selectively in first and second directions and the contour predicting means is capable of predicting a contour transition whenever the peripheral edge is scanned in either of the first and second directions.

18. A method of positioning in a preselected alignment a specimen having a peripheral edge that includes adjacent edge segments of first and second contours with a contour transition between them, comprising:
   releasibly holding the specimen at a first specimen location;
   detecting the peripheral edge of the specimen at plural scan rates, the contour transition being detected at a first scan rate and the first and second contours each being detected at a greater scan rate;
   forming a map of the specimen from the detecting of the peripheral edge; and
   in accordance with the map, positioning the specimen for processing in the preselected alignment without changing the first specimen location at which the specimen is held.

19. The method of claim 18 in which the peripheral edge of the specimen lies substantially in a plane and the positioning of the specimen for processing in the preselected alignment includes rotating the specimen about a rotational axis that is perpendicular to the plane of the specimen and translating the specimen in first and second transverse directions that are substantially parallel to the plane.

20. The method of claim 19 in which the first and second transverse directions are substantially perpendicular to each other.

21. The method of claim 19 in which the peripheral edge of the specimen is detected by an edge detector and the detection of the peripheral edge includes moving it past the edge detector to form the map of the specimen.

22. The method of claim 21 in which the moving of the peripheral edge of the specimen past the edge detector includes rotating the specimen and translating it in only the first direction.

* * * * *